(12) United States Patent
Shin et al.

(10) Patent No.: US 8,030,644 B2
(45) Date of Patent: Oct. 4, 2011

(54) ORGANIC INSULATOR COMPOSITION, ORGANIC INSULATING FILM HAVING THE SAME, ORGANIC THIN FILM TRANSISTOR HAVING THE SAME AND ELECTRONIC DEVICE HAVING THE SAME AND METHODS OF FORMING THE SAME

(75) Inventors: Jung Han Shin, Suwon-si (KR); Eun Kyung Lee, Seoul (KR); Eun Jeong Jeong, Seongnam-si (KR); Joo Young Kim, Suwon-Si (KR); Hyun Sik Moon, Seoul (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1159 days.

(21) Appl. No.: 11/481,843

(22) Filed: Jul. 7, 2006

(65) Prior Publication Data

US 2007/0129473 A1    Jun. 7, 2007

(30) Foreign Application Priority Data

Dec. 6, 2005   (KR) .................. 10-2005-0117964

(51) Int. Cl.
  *H01L 35/24*   (2006.01)
(52) U.S. Cl. .................. 257/40; 257/759; 257/E51.007; 257/E51.027; 438/99; 106/287.1; 106/287.13
(58) Field of Classification Search ............. 257/40, 257/642, 759, E51.007, E51.024, E51.027, 257/E51.046, E21.261; 438/99; 106/287.1, 106/287.13, 287.14, 287.15
See application file for complete search history.

(56) References Cited

U.S. PATENT DOCUMENTS

| | | | |
|---|---|---|---|
| 5,644,014 A * | 7/1997 | Schmidt et al. ............ | 528/43 |
| 5,981,970 A | 11/1999 | Dimitrakopoulos et al. | |
| 6,000,339 A * | 12/1999 | Matsuzawa ............ | 106/287.14 |
| 6,232,157 B1 | 5/2001 | Dodabalapur et al. | |
| 7,186,634 B2 * | 3/2007 | Yoneya ...................... | 438/597 |
| 2009/0004098 A1 * | 1/2009 | Schmidt et al. ............ | 423/608 |

FOREIGN PATENT DOCUMENTS

| | | |
|---|---|---|
| KR | 10-2004-0037968 | 5/2004 |
| KR | 10-2005-0004565 | 1/2005 |

OTHER PUBLICATIONS

C.D. Dimitrakopoulos et al., "Low-Voltage Organic Transistors on Plastic Comprising High-Dielectric Constant Gate Insulators," *Science*, vol. 283, pp. 822-824 (Feb. 5, 1999).
Korean Office Action dated Jul. 26, 2011.

* cited by examiner

*Primary Examiner* — Matthew Landau
*Assistant Examiner* — Colleen E Snow
(74) *Attorney, Agent, or Firm* — Harness, Dickey & Pierce, P.L.C.

(57) ABSTRACT

Example embodiments of the present invention relate to an organic insulator composition, an organic insulating film having the organic insulator composition, an organic thin film transistor having the organic insulating film, an electronic device having the organic thin film transistor and methods of forming the same. Other example embodiments of the present invention relate to an organic insulator composition including a fluorinated silane compound that may be used to improve the charge carrier mobility and hysteresis of an organic thin film transistor. An organic insulator composition including a fluorinated silane compound and an organic thin film transistor using the same is provided. The hysteresis and physical properties, e.g., threshold voltage and/or charge carrier mobility, of the organic thin film transistor may be improved by the use of the organic insulator composition. The organic thin film transistor may be effectively used in the manufacture of a variety of electronic devices including liquid crystal displays (LCDs) and/or photovoltaic devices.

19 Claims, 4 Drawing Sheets

ORGANIC INSULATOR COMPOSITION, ORGANIC INSULATING FILM HAVING THE SAME, ORGANIC THIN FILM TRANSISTOR HAVING THE SAME AND ELECTRONIC DEVICE HAVING THE SAME AND METHODS OF FORMING THE SAME

PRIORITY STATEMENT

This non-provisional application claims priority under 35 U.S.C. §119(a) to Korean Patent Application No. 2005-117964, filed on Dec. 6, 2005, in the Korean Intellectual Property Office (KIPO), the entire contents of which are herein incorporated by reference.

BACKGROUND

1. Field

Example embodiments of the present invention relate to an organic insulator composition, an organic insulating film having the organic insulator composition, an organic thin film transistor having the organic insulator composition, an electronic device having the organic thin film transistor and methods of forming the same. Other example embodiments of the present invention relate to an organic insulator composition including a fluorinated silane compound that may be used to improve the charge carrier mobility and hysteresis of an organic thin film transistor.

2. Description of the Related Art

Flat panel displays (e.g., liquid crystal displays and/or organic electroluminescence displays) may include a number of thin film transistors (TFTs) for driving the devices. Thin film transistors may include a gate electrode, a gate insulating layer, source and/or drain electrodes and a semiconductor layer activated in response to the driving of the gate electrode. Amorphous silicon (a-Si) and polycrystalline silicon (poly-Si) may be currently used as channel materials for semiconductor layers of thin film transistors (TFTs). Recent developments in various conductive organic materials have led to a great deal of research on organic thin film transistors (OTFTs) using organic semiconductor materials (e.g., pentacene, polythiophene and/or any other suitable material). OTFTs may have lower charge carrier mobility, higher driving voltage and/or higher threshold voltage when compared to transistors using amorphous Si. In order to simplify fabrication and reduce fabrication costs, OTFTs may be fabricated by an all-printing and/or all-spin process on plastic substrates. There has been research into increasing the charge carrier mobility at the interface between gate insulating layers and organic semiconductor layers and forming gate insulating layers by a simplified procedure.

According to the conventional art, a gate insulating layer may be made of an inorganic metal oxide (e.g., $Ba_xSr_{1-x}TiO_3$ (barium strontium titanate (BST)), $Ta_2O_5$, $Y_2O_3$, $TiO_2$ and/or any other suitable inorganic metal oxide) or a ferroelectric insulator (e.g., $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, $Bi_4Ti_3O_{12}$ and/or any other suitable ferroelectric insulator) and may be formed by chemical vapor deposition, physical vapor deposition, sputtering, and/or sol-gel coating. Although the driving voltage of the OTFTs may be reduced to as low as about −5V, the charge carrier mobility may still be about 0.6 cm²/Vs or less. Because most fabrication processes require a relatively high temperature of about 200° C.~about 400° C., plastic substrates suitable for use in the manufacture of flexible displays may not be used. Common wet processes (e.g., simple coating and/or printing) may not be applied to fabricate the devices. The conventional art may also suggest the use of polyimide, benzocyclobutene and photoacryls as materials for organic insulating films. The characteristics of organic insulating films formed using the materials may be insufficient to replace inorganic insulating films.

SUMMARY

Example embodiments of the present invention relate to an organic insulator composition, an organic insulating film having the organic insulator composition, an organic thin film transistor having the organic insulator composition, an electronic device having the organic thin film transistor and methods of forming the same. Other example embodiments of the present invention relate to an organic insulator composition including a fluorinated silane compound that may be used to improve the charge carrier mobility and hysteresis of an organic thin film transistor.

Example embodiments of the present invention provide an organic insulator composition that functions as a fluorine-based surface modifier to simplify the formation of an organic insulating film. The organic insulator composition may be used to improve physical properties (e.g., charge carrier mobility and/or hysteresis) of an organic thin film transistor. Example embodiments of the present invention provide organic thin film transistors with improved electrical properties (e.g., charge carrier mobility) and organic insulating films that may be more simply formed by common wet processes.

Example embodiments of the present invention provide an organic thin film transistor including an organic insulating film formed from the organic insulator composition.

In accordance with example embodiments of the present invention, there is provided an organic insulator composition, comprising:

(i) a silane compound represented by Formula 1 or 2 below:

$$R_1SiX_1X_2X_3 \quad (1)$$

wherein $R_1$ is selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group,

$$R_1R_2SiX_1X_2 \quad (2)$$

wherein $R_1$ and $R_2$ are each independently selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$ and $X_2$ are each independently a halogen atom or a $C_1$-$C_{20}$ alkoxy group, with the proviso that at least one of $X_1$ and $X_2$ is a hydrolysable functional group, a mixture or polymer thereof, or a mixture or copolymer thereof with a compound represented by any one of Formulae 3 to 5 below:

$$SiX_1X_2X_3X_4 \quad (3)$$

$X_1$, $X_2$, $X_3$ and $X_4$ are each independently a halogen atom or a $C_1$-$C_{20}$ alkoxy group, with the proviso that at least one of $X_1$, $X_2$, $X_3$ and $X_4$ is a hydrolysable functional group,

$$R_3SiX_1X_2X_3 \quad (4)$$

wherein R₃ is selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group, $$R_3R_4SiX_1X_2 \quad (5)$$

wherein $R_3$ and $R_4$ are each independently selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$ and $X_2$ are each independently a halogen atom or a $C_1$-$C_{20}$ alkoxy group, with the proviso that at least one of $X_1$ and $X_2$ is a hydrolysable functional group;

(ii) an organometallic compound; and (iii) a solvent.

According to example embodiments of the present invention, the organic insulator composition may further include an organic and/or an inorganic polymer matrix.

In accordance with other example embodiments of the present invention, there is provided an organic thin film transistor including a substrate, a gate electrode, an organic insulating film, an organic semiconductor layer and source/drain electrodes, wherein the organic insulating film may be formed from the organic insulator composition.

BRIEF DESCRIPTION OF THE DRAWINGS

Example embodiments of the present invention will be more clearly understood from the following detailed description taken in conjunction with the accompanying drawings.

FIGS. 1 and 2 are diagrams illustrating the structures of organic thin film transistors according to example embodiments of the present invention;

FIG. 3 is a graph illustrating the current transfer characteristics of an organic thin film transistor fabricated in Example 1 according to example embodiments of the present invention;

FIG. 4 is a graph illustrating the current transfer characteristics of an organic thin film transistor fabricated in Example 2 according to example embodiments of the present invention;

FIG. 5 is a graph illustrating the current transfer characteristics of an organic thin film transistor fabricated in Comparative Example 1 according to example embodiments of the present invention;

FIG. 6 is a graph illustrating the current transfer characteristics of an organic thin film transistor fabricated in Comparative Example 2 according to example embodiments of the present invention;

FIG. 7 is a graph illustrating the current transfer characteristics of an organic thin film transistor fabricated in Example 3 according to example embodiments of the present invention; and FIG. 8 is a graph illustrating the current transfer characteristics of organic thin film transistors fabricated in Comparative Examples 3 and 4 according to example embodiments of the present invention.

DESCRIPTION OF EXAMPLE EMBODIMENTS

Figure 1:
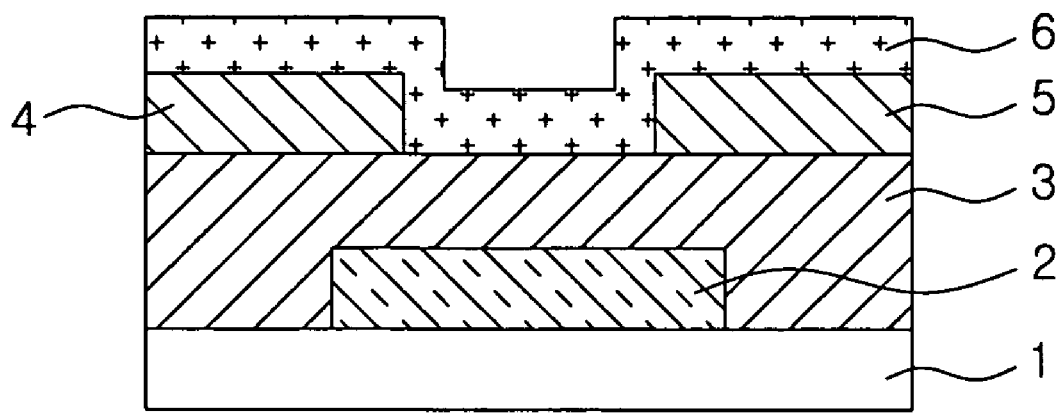
FIGS. 1-8 represent non-limiting, example embodiments of the present invention as described herein.

Hereinafter, various example embodiments of the present invention will be explained in greater detail with reference to the accompanying drawings, in which some example embodiments of the present invention are shown. Example embodiments of the present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of the example embodiments of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention relate to an organic insulator composition, an organic insulating film having the organic insulator composition, an organic thin film transistor having the organic insulator composition, an electronic device having the organic thin film transistor and methods of forming the same. Other example embodiments of the present invention relate to an organic insulator composition including a fluorinated silane compound that may be used to improve the charge carrier mobility and hysteresis of an organic thin film transistor.

Example embodiments of the present invention provide an organic insulator composition, comprising:

(i) a silane compound represented by Formula 1 or 2 below:

$$R_1SiX_1X_2X_3 \qquad (1)$$

wherein $R_1$ is selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group, $$R_1R_2SiX_1X_2 \qquad (2)$$

wherein $R_1$ and $R_2$ are each independently selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$ and $X_2$ are each independently a halogen atom or a $C_1$-$C_{20}$ alkoxy group, with the proviso that at least one of $X_1$ and $X_2$ is a hydrolysable functional group, a mixture or polymer thereof, or a mixture or copolymer thereof with a compound represented by any one of Formulae 3 to 5 below:

$$SiX_1X_2X_3X_4 \qquad (3)$$

$X_1$, $X_2$, $X_3$ and $X_4$ are each independently a halogen atom or a $C_1$-$C_{20}$ alkoxy group, with the proviso that at least one of $X_1$, $X_2$, $X_3$ and $X_4$ is a hydrolysable functional group, $$R_3SiX_1X_2X_3 \qquad (4)$$

wherein $R_3$ is selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group, $$R_3R_4SiX_1X_2 \qquad (5)$$

wherein $R_3$ and $R_4$ are each independently selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$ and $X_2$ are each independently a halogen atom or a $C_1$-$C_{20}$ alkoxy group, with the proviso that at least one of $X_1$ and $X_2$ is a hydrolysable functional group;

(ii) an organometallic compound; and (iii) a solvent.

Organic thin film transistors, comprising an organic semiconductor layer made of pentacene, and a gate insulating film, made of a non-fluorinated silane compound, may have a hysteresis ranging from about 15 V to about 20 V. Because the silane compound used in the organic insulator composition of example embodiments of the present invention contains at least one fluorine atom at the terminal position of a substituent (e.g., alkyl), the organic insulator composition may be used to form a fluorine-containing organic insulating film, thereby eliminating the need for additional coating of a fluorine-based surface modifier on an insulating film made of a non-fluorinated silane compound. According to example embodiments of the present invention, the organic insulator composition may be used to fabricate an organic thin film transistor having a hysteresis of less than about 10 V without any deterioration in the charge carrier mobility of the organic thin film transistor.

According to example embodiments of the present invention, the silane compound used in the organic insulator composition may be a compound represented by Formula 1 or 2 below:

$$R_1SiX_1X_2X_3 \qquad (1)$$

wherein $R_1$ is selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group, $$R_1R_2SiX_1X_2 \qquad (2)$$

wherein $R_1$ and $R_2$ are each independently selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$ and $X_2$ are each independently a halogen atom or a $C_1$-$C_{20}$ alkoxy group, with the proviso that at least one of $X_1$ and $X_2$ is a hydrolysable functional group, or a mixture or polymer thereof.

Specific examples of the silane compound may include, but are not limited to, trimethoxy trifluoropropylsilane, (heptadecafluoro-1,1,2,2-tetrahydrodecyl)triethoxysilane, pentafluorophenylpropyl trimethoxysilane, (tridecafluoro-1,1,2,2-tetrahydrooctyl)triethoxysilane, (3,3,3-trifluoropropyl)

methoxydichlorosilane, (3,3,3-trifluoropropyl)propyldimethoxysilane, (3,3,3-trifluoropropyl)diethoxychlorosilane, and (3,3,3-trifluoropropyl)trimethoxysilane.

The silane compound used in the organic insulator composition of example embodiments of the present invention may be a mixture or copolymer of the compound of Formula 1 or 2 and a compound represented by any one of Formulae 3 to 5 below:

$$SiX_1X_2X_3X_4 \quad (3)$$

$X_1$, $X_2$, $X_3$ and $X_4$ are each independently a halogen atom or a $C_1$-$C_{20}$ alkoxy group, with the proviso that at least one of $X_1$, $X_2$, $X_3$ and $X_4$ is a hydrolysable functional group;

$$R_3SiX_1X_2X_3 \quad (4)$$

wherein $R_3$ is selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group; and $$R_3R_4SiX_1X_2 \quad (5)$$

wherein $R_3$ and $R_4$ are each independently selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$ and $X_2$ are each independently a halogen atom or a $C_1$-$C_{20}$ alkoxy group, with the proviso that at least one of $X_1$ and $X_2$ is a hydrolysable functional group.

The term "substituted" as used in Formulae 3 to 5 means that the groups may be substituted with acryl, amino, hydroxyl, carboxyl, aldehyde, epoxy, nitrile, and/or other groups. According to example embodiments of the present invention, the content of the silane compound in the organic insulator composition may be varied depending on the other components (e.g., the organometallic compound, the organic or inorganic polymer matrix and/or the solvent) and film formation conditions. The content of the silane compound may be, for example, about 5%-about 70% by weight, for example, about 15%-about 35% by weight. Below about 5% by weight, the size of organic semiconductor particles may be affected so that the characteristics (e.g., charge carrier mobility) of a final device may be deteriorated. Above about 70% by weight, the durability of the final film may be weakened so that the characteristics of a final device may become unstable.

According to example embodiments of the present invention, organometallic compounds, used in the organic insulator composition, may include those having improved insulating properties and/or a higher dielectric constant (e.g., metal oxides having a dielectric constant of about 4 or higher). Non-limiting specific examples of the organometallic compound may include the following compounds: 1) titanium compounds, for example, titanium (IV) n-butoxide, titanium (IV) t-butoxide, titanium (IV) ethoxide, titanium (IV) 2-ethylhexoxide, titanium (IV) isopropoxide, titanium (IV) (diisopropoxide) bis(acetylacetonate), titanium (IV) oxide bis (acetylacetonate), trichlorotris(tetrahydrofuran) titanium (DI), tris(2,2,6,6-tetramethyl-3,5-heptanedionato) titanium (III), (trimethyl)pentamethyl cyclopentadienyltitanium (IV), pentamethylcyclopentadienyltitanium trichloride (IV), pentamethylcyclopentadienyltitanium trimethoxide (IV), tetrachlorobis(cyclohexylmercapto) titanium (IV), tetrachlorobis(tetrahydrofuran)titanium (IV), tetrachlorodiamminetitanium (IV), tetrakis(diethylamino)titanium (IV), tetrakis(dimethylamino)titanium (IV), bis(t-butylcyclopentadienyl)titanium dichloride, bis(cyclopentadienyl)dicarbonyl titanium (II), bis(cyclopentadienyl)titanium dichloride, bis(ethylcyclopentadienyl)titanium dichloride, bis(pentamethylcyclopentadienyl)titanium dichloride, bis(isopropylcyclopentadienyl)titanium dichloride, tris(2,2,6,6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptanedionato)titanium (IV), dimethylbis(t-butylcyclopentadienyl)titanium (IV), and di(isopropoxide)bis(2,2,6,6-tetramethyl-3,5-heptanedionato)titanium (IV);

2) zirconium and hafnium compounds, for example, zirconium (IV) n-butoxide, zirconium (IV) t-butoxide, zirconium (IV) ethoxide, zirconium (IV) isopropoxide, zirconium (IV) n-propoxide, zirconium (IV) acetylacetonate, zirconium (IV) hexafluoroacetylacetonate, zirconium (IV) trifluoroacetylacetonate, tetrakis(diethylamino)zirconium, tetrakis(dimethylamino)zirconium, tetrakis(2,2,6,6-tetramethyl-3,5-heptanedionato)zirconium (IV), zirconium (IV) sulfate tetrahydrate, hafnium (IV) n-butoxide, hafnium (IV) t-butoxide, hafnium (IV) ethoxide, hafnium (IV) isopropoxide, hafnium (IV) isopropoxide monoisopropylate, hafnium (IV) acetylacetonate, and tetrakis(dimethylamino)hafnium; and 3) aluminum compounds, for example, aluminum n-butoxide, aluminum t-butoxide, aluminum sec-butoxide, aluminum ethoxide, aluminum isopropoxide, aluminum acetylacetonate, aluminum hexafluoroacetylacetonate, aluminum trifluoroacetylacetonate, and/or tris(2,2,6,6-tetramethyl-3,5-heptanedionato)aluminum.

According to example embodiments of the present invention, the content of the organometallic compound in the organic insulator composition may be, for example, about 0.01 to about 10% by weight. When the organometallic compound is present in an amount of less than about 0.01% by weight, addition of the organometallic compound may have little or no effect. When the organometallic compound is present in an amount exceeding about 10% by weight, the composition may become heterogeneous and the leakage current of a final device may be increased.

According to example embodiments of the present invention, the organic solvent used in the organic insulator composition may not be restricted so long as it may be commonly used to produce an organic insulating film. Specific examples of the organic solvent may include aliphatic hydrocarbon solvents (e.g., hexane and/or heptane), aromatic hydrocarbon solvents (e.g., toluene, pyridine, quinoline, anisole, mesitylene and/or xylene), ketone-based solvents (e.g., cyclohexanone, methyl ethyl ketone, 4-heptanone, methyl isobutyl ketone, 1-methyl-2-pyrrolidinone, and/or acetone), ether-based solvents (e.g., tetrahydrofuran and/or isopropyl ether) acetate-based solvents (e.g., ethyl acetate, butyl acetate and/or propylene glycol methyl ether acetate), alcohol-based solvents (e.g., isopropyl alcohol and/or butyl alcohol), amide-based solvents (e.g., dimethylacetamide and/or dimethylformamide), silicon-based solvents and/or mixtures thereof. The content of the organic solvent may be, for example, about 10% to about 94% by weight based on the total weight of the organic insulator composition.

According to example embodiments of the present invention, the organic insulator composition may further include an organic and/or inorganic polymer matrix. The organic and/or inorganic polymer matrix may be selected from the group consisting of polyvinyl phenols and their derivatives, polyvinyl alcohols and their derivatives, polyacryls and their derivatives, polynorbornenes and their derivatives, polyethylene glycol derivatives, polypropylene glycol derivatives, polysiloxane derivatives, cellulose derivatives and/or copolymers thereof. The organic and/or inorganic polymer matrix may have a molecular weight of about 1,000 to about 1,000,000. These polymers may contain a hydroxyl group, a carboxyl group or its salt, a phosphate group or its salt, a sulfonate group or its salt, and/or an amine group or its salt at the terminal position of the backbone or side chains of the polymers.

The organic or inorganic polymer matrix may be present in an amount of, for example, about 0.01% to about 10% by weight, based on the total weight of the organic insulator composition. Above about 10% by weight, the durability of the final film may be weakened, making the characteristics of a final device unstable. According to example embodiments of the present invention, the organic insulator composition may be coated on a substrate, followed by annealing to produce an organic insulating film. The application of the organic insulator composition to the substrate may be performed by various coating techniques, including spin coating, dip coating, roll coating, screen coating, spray coating, spin casting, flow coating, screen printing, ink jet, drop casting, and/or any other suitable coating technique. In view of ease of coating and thickness uniformity, spin coating may be performed. Upon spin coating, the spin speed may be adjusted within the range of, for example, about 400 rpm to about 4,000 rpm. The annealing may be performed by heating the coated substrate to a temperature of about 50° C. or higher for more than about one minute.

According to example embodiments of the present invention, the organic insulator composition may function as a fluorine-based surface modifier to solve conventional problems (e.g., inconvenience associated with separate coating of an organic insulator and a fluorine-based surface modifier). Example embodiments of the present invention may simplify the formation of an organic insulating film. According to example embodiments of the present invention, the organic insulator composition may be used to decrease the hysteresis of an organic thin film transistor, including an organic semiconductor layer made of pentacene, to less than about 10 V. According to example embodiments of the present invention, the organic insulator composition may be used to increase the charge carrier mobility of a solution-processible organic thin film transistor.

Because the organic insulator composition of example embodiments of the present invention may improve the unit characteristics of an organic thin film transistor, the transistor may be effectively used in the manufacture of a variety of electronic devices, including liquid crystal displays (LCDs), photovoltaic devices, organic light-emitting devices (OLEDs), sensors, memory devices and/or integrated circuits. According to example embodiments of the present invention, the organic insulator composition may be applied to the devices by processes commonly known in the art. Other example embodiments of the present invention may also be directed to an organic thin film transistor formed from the organic insulator composition.

According to example embodiments of the present invention, the organic thin film transistor may include a substrate, a gate electrode, an organic insulating film, an organic semiconductor layer and source/drain electrodes, wherein the organic insulating film may be formed from the organic insulator composition.

Figure 2:
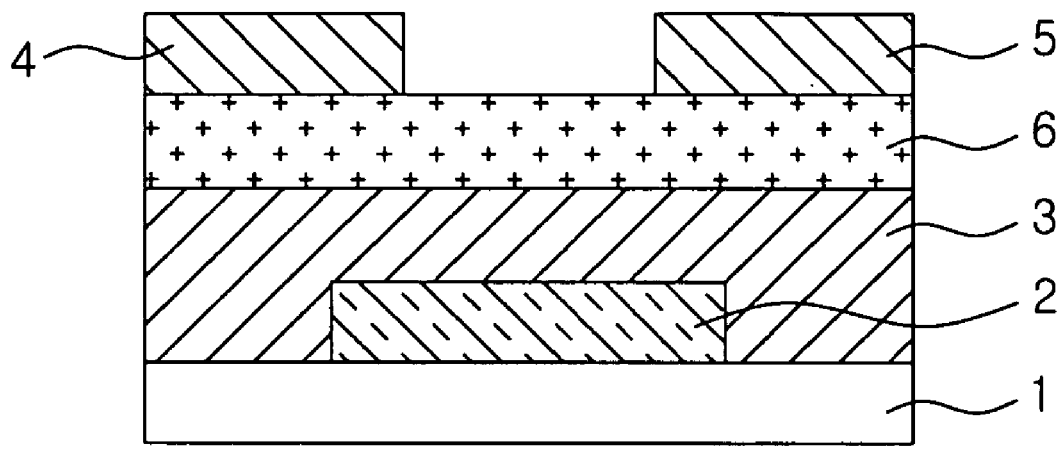
Figure 3:
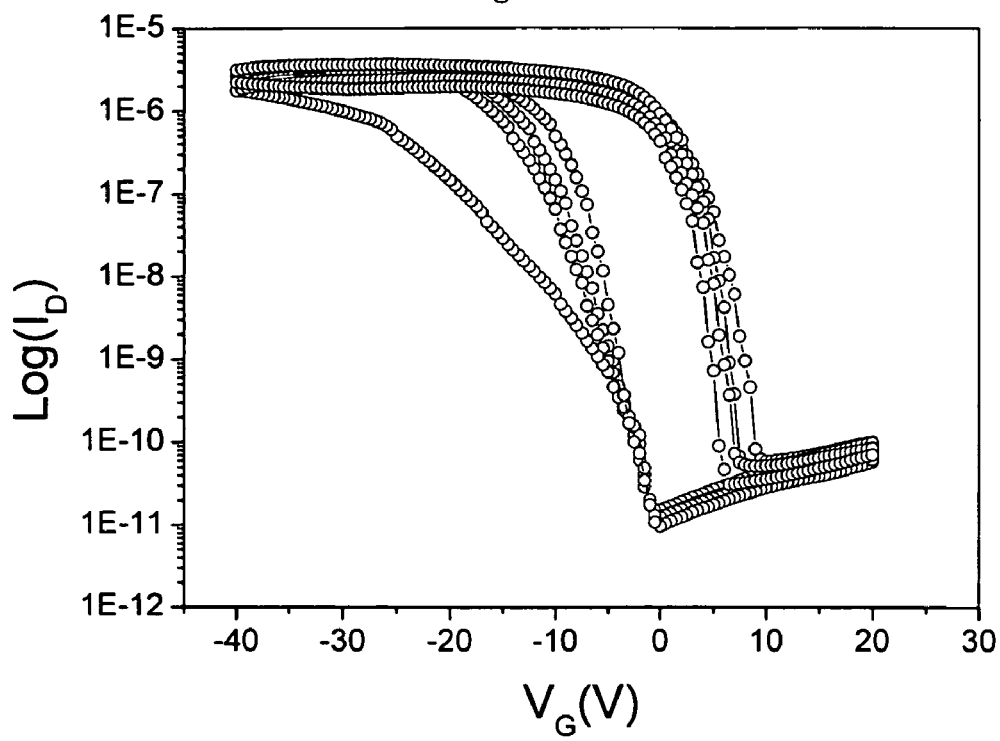
Figure 4:
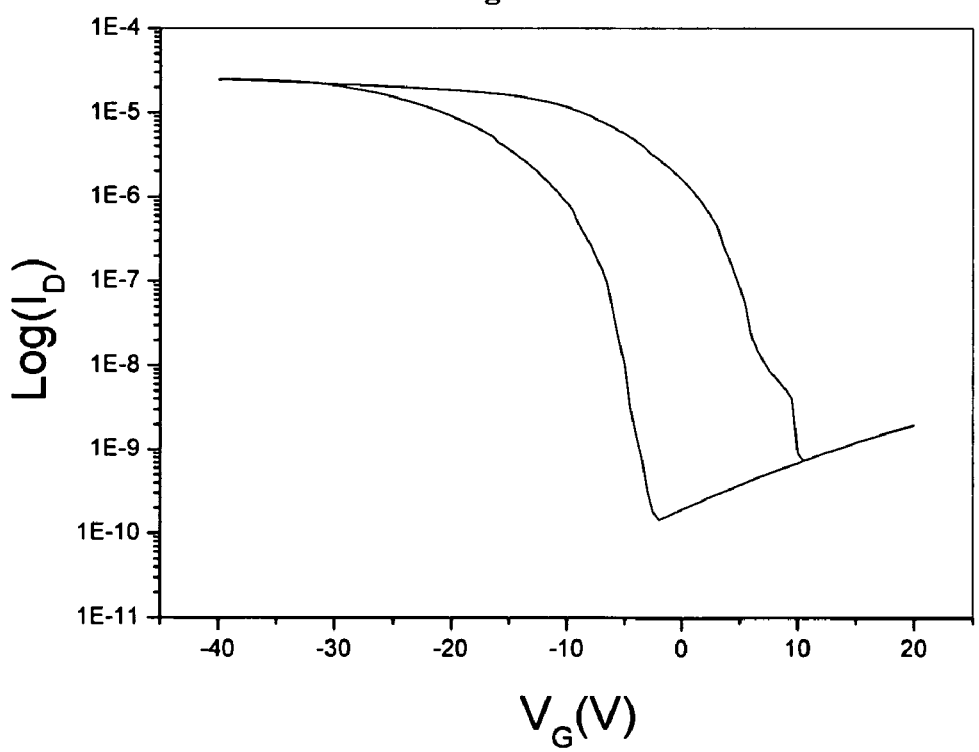
Figure 5:
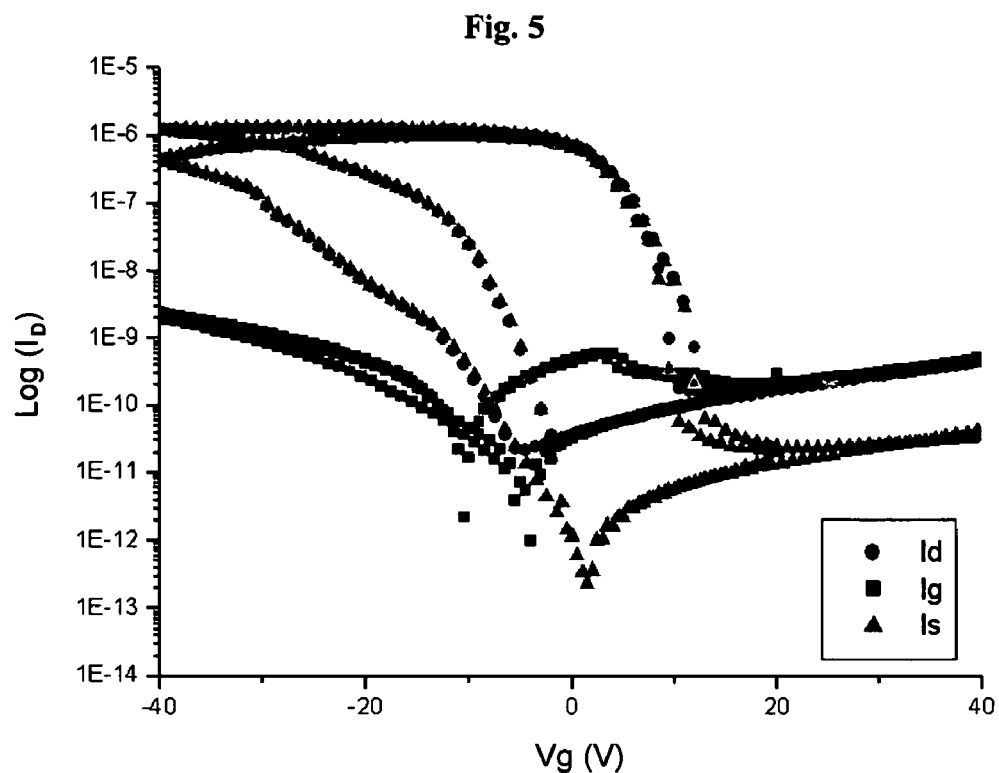
Figure 6:
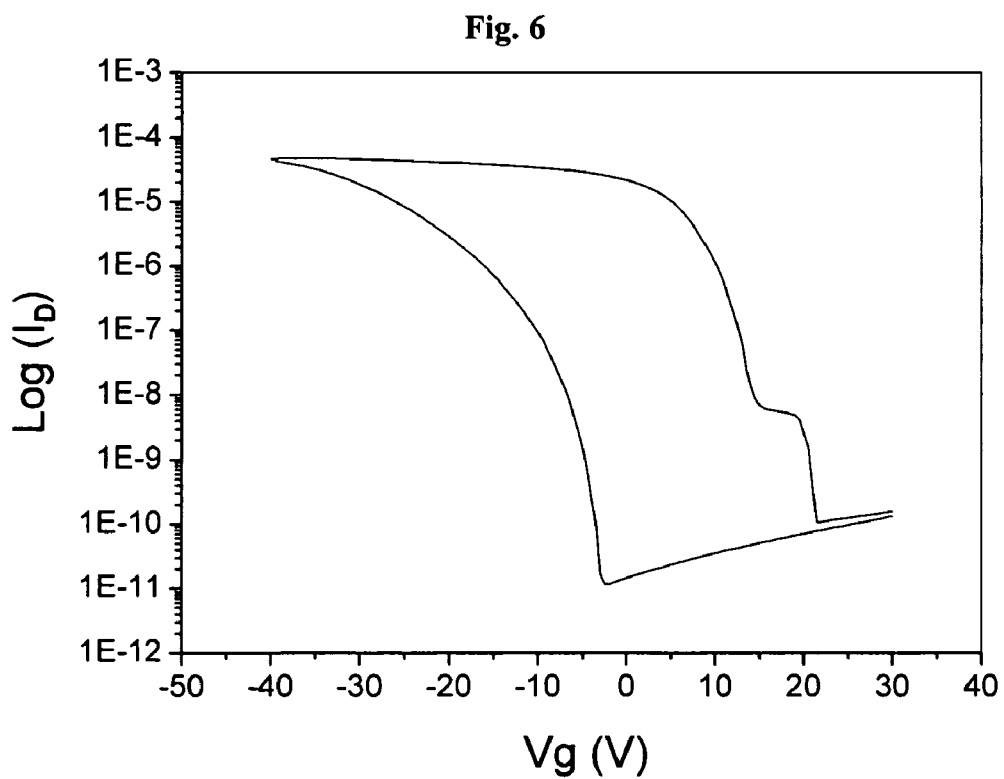

FIG. 1 is a diagram illustrating the structure of a bottom-contact organic thin film transistor according to example embodiments of the present invention. FIG. 2 is a diagram illustrating the structure of a top-contact organic thin film transistor according to example embodiments of the present invention. The structure of the thin film transistors may be variously modified if it does not impair the purpose of example embodiments of the present invention. The substrate 1 of the organic thin film transistor may be made of glass, silicon, plastic and/or any other suitable material. Materials for the gate electrode 2 and the source/drain electrodes 4 and 5 may be metals and electrically conductive polymers commonly used in the art. Specific examples of these electrodes include, but are not limited to, doped silicon (Si) and metals (e.g., gold (Au), silver (Ag), aluminum (Al), copper (Cu), nickel (Ni), chromium (Cr), molybdenum (Mo), tungsten (W) and/or indium tin oxide (ITO)). After the substrate is washed to remove impurities present therein, the metal may be deposited thereon by a common technique (e.g., chemical vapor deposition, plasma chemical vapor deposition and/or sputtering) followed by patterning to form the gate electrode. Specific examples of materials for the organic semiconductor layer 6 may include, but are not limited to, pentacene, polythiophene, polyaniline, polyacetylene, polypyrrole, polyphenylene vinylene, and/or derivatives thereof.

Hereinafter, various example embodiments of the present invention will be described in more detail with reference to the following examples. However, these examples are given for the purpose of illustration and are not to be construed as limiting the scope of example embodiments of the present invention.

Synthesis Example 1

Synthesis of Silane Compound A

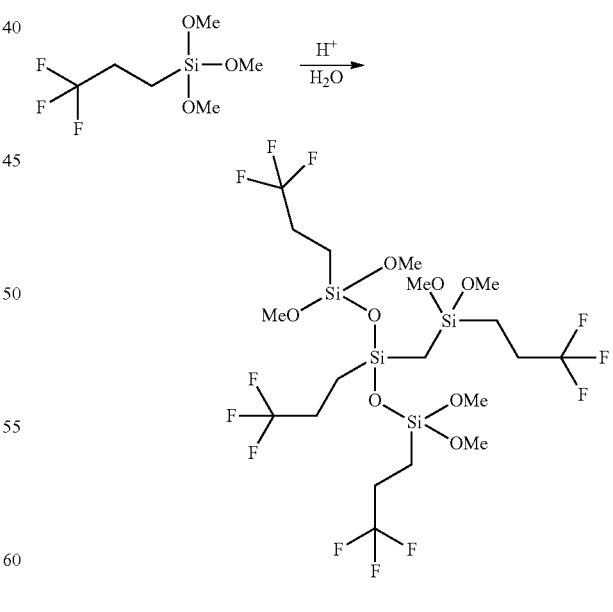

Compound A

About 436.5 g (about 2.0 mol) of (3,3,3,-trifluoropropyl) trimethoxysilane was put in a one-liter reactor under a nitrogen atmosphere and cooled to about −30° C. About 6 ml (about 0.006 mol) of about 1.0N HCl and about 354 ml (about 199.99 mol) of distilled water were charged into a dropping funnel and installed on the reactor. As the reaction solution was cooled, about 360 ml of the aqueous HCl solution was added dropwise thereto. After completion of the addition, the reaction solution was stirred at about room temperature for about 3 hours. The reaction solution was poured into a separatory funnel and then about 1,000 ml of ethyl acetate and about 1,000 ml of water were added thereto to obtain an organic layer. About 10 g of sodium sulfate was added to the organic layer, stirred for about 2 hours, filtered, and evaporated to remove the solvents. The result was the desired silane compound A (weight-average molecular weight: about 19,000) as a colorless oil.

$^1$H NMR data (ppm): 2.15 (m, 2H), 0.93 (H, 2H)

Synthesis Example 2

Synthesis of Silane Compound B

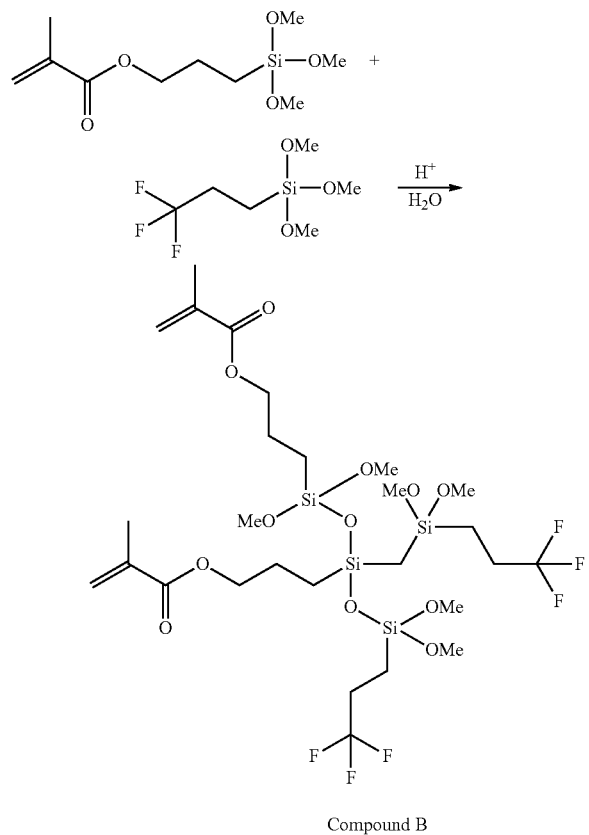

Compound B

About 447.05 g (about 1.8 mol) of 3-(trimethoxysilyl)propyl methacrylate and about 43.65 g (about 0.2 mol) of (3,3,3,-trifluoropropyl)trimethoxysilane were put in a one-liter reactor under a nitrogen atmosphere and cooled to about −30° C. About 6 ml (about 0.006 mol) of about 1.0N HCl and about 354 ml (about 199.99 mol) of distilled water were charged into a dropping funnel and installed on the reactor. As the reaction solution was cooled, about 360 ml of the aqueous HCl solution was added dropwise thereto. After completion of the addition, the reaction solution was stirred at about room temperature for about 3 hours. The reaction solution was poured into a separatory funnel, and then, about 1,000 ml of ethyl acetate and about 1,000 ml of water were added thereto to obtain an organic layer. About 10 g of sodium sulfate was added to the organic layer, stirred for about 2 hours, filtered, and evaporated to remove the solvents. The result was the desired silane compound B (weight-average molecular weight: about 10,000) as a colorless oil. $^1$H NMR data (ppm): 6.09 (s, 1H), 5.55 (s, 1H), 4.01 (t, 2H), 3.47 (m, 1H), 3.45 (s, 3H), 1.91 (m, 3H), 1.77 (m, 2H), 0.8 (H 0.2H), 0.69 (m, 2H).

Preparative Example 1

Preparation of Organic Insulator Composition (1)

The silane compound prepared in Synthesis Example 1, titanium t-butoxide and polyvinyl phenol ($M_w$: about 8,000) were mixed in a weight ratio of about 80:15:5 and then the mixture was dissolved in cyclohexanone to prepare a composition (about 20 wt %).

Preparative Example 2

Preparation of Organic Insulator Composition (2)

The silane compound prepared in Synthesis Example 2 and titanium t-butoxide were mixed in a weight ratio of about 70:30 and then the mixture was dissolved in isopropyl alcohol to prepare a composition (about 20 wt %).

Example 1

Fabrication of Bottom-Contact Pentacene TFT

Aluminum was deposited on a clean glass substrate to form an about 800 Å-thick gate electrode. Thereafter, the organic insulator composition prepared in Preparative Example 2 was spin-coated to a thickness of about 8,000 Å thereon at about 2,000 rpm and baked at about 100° C. for about one hour to form an organic insulating film. About 500 Å-thick source/drain ITO electrodes (channel length: about 100 μm, channel width: about 1 mm) were formed on the organic insulating film and pentacene was deposited to a thickness of about 700 Å thereon by organic molecular beam deposition (OMBD) to form an organic semiconductor layer, completing the fabrication of a bottom-contact organic thin film transistor. The structure of the transistor is illustrated in FIG. 1.

Example 2

Fabrication of Top-Contact Pentacene TFT

A top-contact organic thin film transistor was fabricated in the same manner as in Example 1, except that pentacene was deposited on the organic insulating film to form an organic semiconductor layer and then Au source/drain electrodes were formed on the organic semiconductor layer. The structure of the transistor is illustrated in FIG. 2.

Example 3

Fabrication of Printable TFT

A top-contact organic thin film transistor having the structure illustrated in FIG. 2 was fabricated in the same manner as in Example 1, except that a thiophene-thiazole derivative (Formula 6, about 2 wt %) in toluene was spin-coated to a thickness of about 700 Å on the organic insulating film at about 1,000 rpm, baked at about 100° C. under an argon atmosphere for about one hour to form an organic semiconductor layer, followed by the formation of Au source/drain electrodes on the organic semiconductor layer.

about 300 Å on the organic insulating film at about 3,000 rpm, and cured at about 150° C. for about 10 minutes to form a fluorinated polymer thin film.

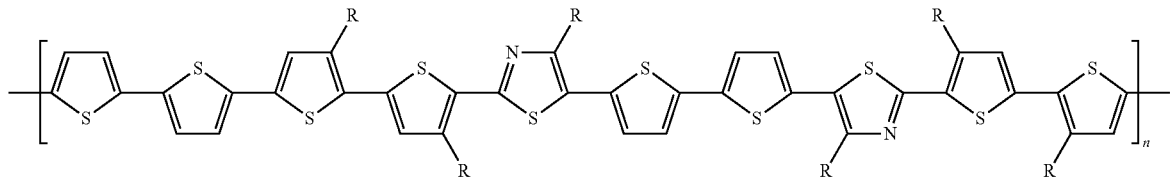

(6)

wherein R is octyl, and n is a number of 5 to 10.

Comparative Example 1

An organic thin film transistor was fabricated in the same manner as in Example 1, except that a polyvinylphenol-based copolymer (Formula 7) as a non-fluorinated silane compound was blended with an acrylic crosslinking agent to prepare an organic insulator composition and then the composition was used to form an organic insulating film.

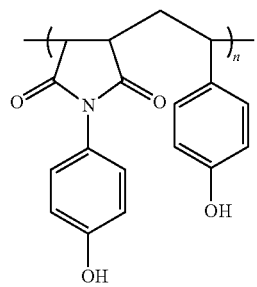

(7)

wherein n is a number of 10 to 1,000.

Comparative Example 2

An organic thin film transistor was fabricated in the same manner as in Example 2, except that the organic insulator composition prepared in Comparative Example 1 was used to form an organic insulating film.

Comparative Example 3

An organic thin film transistor was fabricated in the same manner as in Example 3, except that the organic insulator composition prepared in Comparative Example 1 was spin-coated to form an about 7,000 Å-thick insulating layer and then the thiophene-thiazole derivative was spin-coated on the insulating layer, followed by baking at about 100° C. under a nitrogen atmosphere for one hour to form an organic semiconductor layer.

Comparative Example 4

An organic thin film transistor was fabricated in the same manner as in Comparative Example 3, except that a solution of the maleimide-styrene copolymer derivative (Formula 8, about 2 wt %, weight-average molecular weight: about ≧10,000) in cyclohexanone was spin-coated to a thickness of

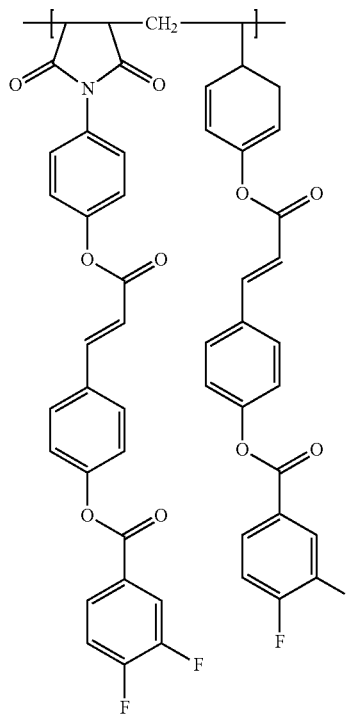

(8)

The current transfer characteristics of the organic thin film transistors fabricated in Examples 1 to 3 and Comparative Examples 1 to 4 were measured using a KEITHLEY semiconductor analyzer (4200-SCS), and the obtained results are illustrated in FIGS. 3 to 8.

FIGS. 3 to 6 are graphs illustrating the current transfer characteristics of the organic thin film transistors fabricated in Examples 1 and 2 and Comparative Examples 1 and 2 according to example embodiments of the present invention. The graphs indicate that the organic thin film transistors using the conventional organic insulating films have a hysteresis of about 15 V to about 20 V, whereas the organic thin film transistors using the organic insulating compositions, according to example embodiments of the present invention, have a hysteresis of less than about 10 V.

Figure 7:
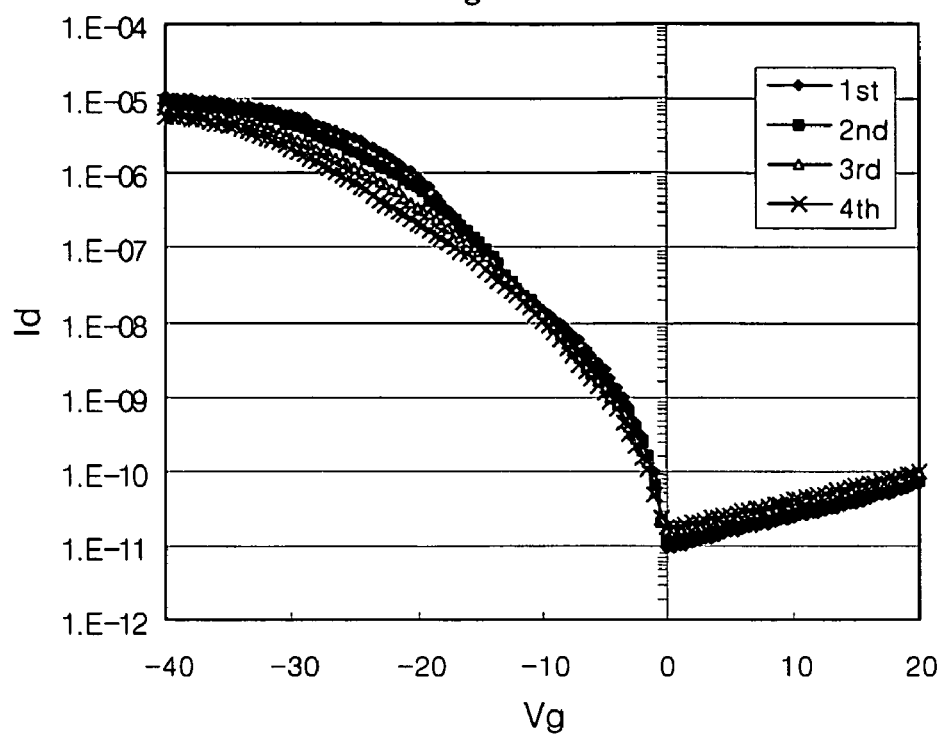
Figure 8:
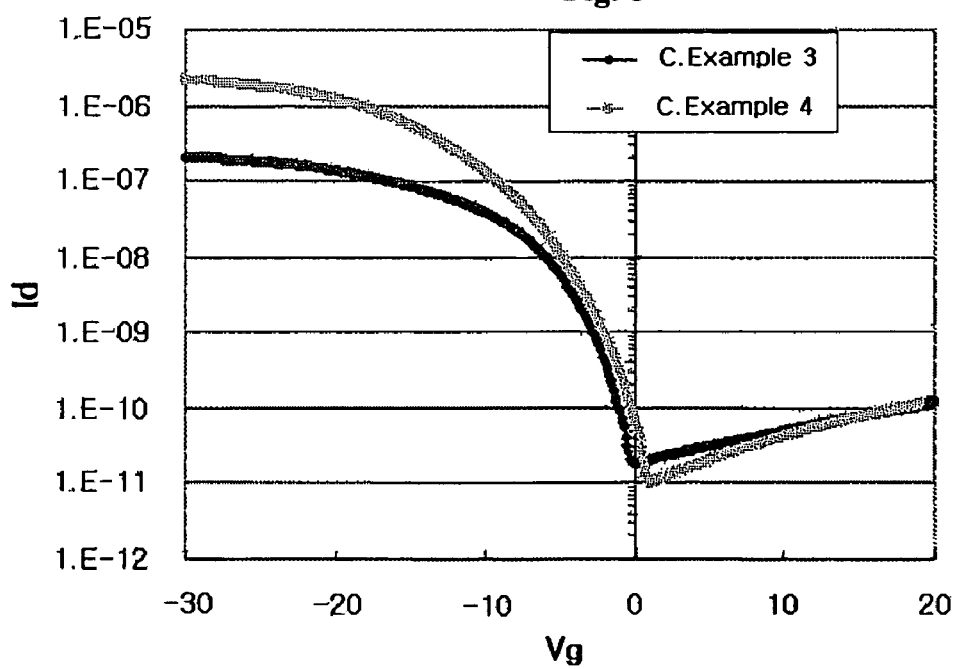

FIG. 7 is a graph showing the current transfer characteristics of the organic thin film transistor fabricated in Example 3 according to example embodiments of the present invention and FIG. 8 is a graph illustrating the current transfer characteristics of the organic thin film transistors fabricated in Comparative Examples 3 and 4 according to example embodiments of the present invention. According to example embodiments of the present invention, the graphs indicate that the organic thin film transistor, using the organic insulating composition of example embodiments of the present invention exhibits improved charge carrier mobility, compared to the organic thin film transistor using the conventional $SiO_2$ insulating film and the organic thin film transistor fabricated by coating the conventional $SiO_2$ insulating film with the fluorine-based surface modifier.

The charge carrier mobility and off-state leakage current of the organic thin film transistors were calculated from the graphs of FIGS. 3 to 8, and the results are illustrated in Table 1 below.

1) Charge carrier mobility

The charge carrier mobility was calculated from the slope of a graph representing the relationship between $(ISD)^{1/2}$ and VG from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$slope = \sqrt{\frac{\mu C_0 W}{2L}}$$

$$\mu_{FET} = (slope)^2 \frac{2L}{C_0 W}$$

In the above equations, ISD: source-drain current, μ and μFET: charge carrier mobility, Co: capacitance of the oxide film, W: channel width, L: channel length, VG: gate voltage, and VT: threshold voltage. The threshold voltage (VT) was obtained from the intersection between the VG axis and the extension line of the linear portion in the graph of $(ISD)^{1/2}$ versus VG. As the absolute value of the threshold voltage approximates to about zero, the consumption of electric power decreases.

2) $I_{on}/I_{off}$ Ratio

The $I_{on}/I_{off}$ ratio was determined from a ratio of an increased current in the on-state to a reduced current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$: increased current, $I_{off}$: off-state leakage current, μ: charge carrier mobility, a: conductivity of thin film, q: electric charge, $N_A$: electric charge density, t: thickness of semiconductor film, $C_O$: capacitance of insulating film, and $V_D$: drain voltage. As can be seen from this equation, the larger the dielectric constant and the smaller the thickness of the dielectric film, the larger the $I_{on}/I_{off}$ ratio. Therefore, the kind and thickness of the dielectric film may be crucial factors in determining the $I_{on}/I_{off}$ ratio. The off-state leakage current ($I_{off}$), which is a current flowing in the off-state, was determined from the reduced current in the off-state.

3) Dielectric Constant

The dielectric constant was measured in accordance with the following procedure. First, each of the organic insulator compositions prepared in Preparative Examples 1 and 2 was applied to an aluminum substrate to form an about 2,000 Å-thick film, and baked at about 70° C. for about one hour and about 110° C. for about 30 minutes, sequentially, to form an insulating layer. Subsequently, aluminum was deposited on the insulating layer to produce a metal-insulator-metal (MIM) capacitor. The insulating properties and dielectric constant of the capacitor were measured at about 20 Hz. The dielectric constant of the capacitor was calculated from the measured capacitance $C_0$ according to the following equation:

$$C_0 = \in \in_0 (A/d)$$

where A is the area of the capacitor, d is the thickness of the insulator, and $\in$ and $\delta 0$ are the dielectric constant of the insulator and vacuum, respectively.

The dielectric constant of the organic insulator compositions prepared in Examples 1 to 3 and Comparative Examples 1 to 4, and the driving characteristics of the organic thin film transistors using the organic insulator compositions are summarized in Table 1 below.

TABLE 1

|  | Dielectric constant (k) | Threshold voltage (V) | Charge carrier mobility (cm²/Vs) | $I_{on}/I_{off}$ |
|---|---|---|---|---|
| Example 1 | 4.1 | −2 | 0.54 | 5.7 × 10⁵ |
| Example 2 | 4.2 | −5 | 2.3 | 7.6 × 10⁵ |
| Example 3 | 4.2 | −3 | 0.9 | 8.4 × 10⁵ |
| Comparative Example 1 | 4.5 | −1 | 0.088 | 1.7 × 10⁶ |
| Comparative Example 2 | 4.5 | −2 | 3.4 | 3.8 × 10⁶ |
| Comparative Example 3 | 3.8 | −6 | 0.024 | 2.7 × 10⁵ |
| Comparative Example 4 | 3.8 | −2 | 0.25 | 1.3 × 10⁴ |

As can be seen from the data illustrated in Table 1, the organic thin film transistors using the organic insulator compositions of example embodiments of the present invention exhibit improved electrical insulating properties, may have a reduced threshold voltage, regardless of the kind of the organic semiconductor layers deposited, leading to an improvement in driving characteristics. Organic insulator compositions according to example embodiments of the present invention may also exhibit improved physical properties, for example, higher $I_{on}/I_{off}$ and/or higher charge carrier mobility.

Because the organic thin film transistor of example embodiments of the present invention may be fabricated using the organic insulator composition including a fluorinated silane compound, conventional problems (e.g., inconvenience associated with separate coating of an organic insulator and a fluorine-based surface modifier) may be solved, thereby simplifying the fabrication of the organic thin film transistor. The organic insulator composition also may improve the hysteresis of the organic thin film transistor according to example embodiments of the present invention. According to example embodiments of the present invention, the organic insulator composition may improve the physical properties (e.g., threshold voltage and charge carrier mobility) of the organic thin film transistor. Therefore, the organic thin film transistor of example embodiments of the present invention may be effectively used in the manufacture of a variety of electronic devices, including liquid crystal displays (LCDs), photovoltaic devices, organic light-emitting devices (OLEDs), sensors, memory devices and/or integrated circuits.

The foregoing is illustrative of example embodiments of the present invention and is not to be construed as limiting thereof. Although a few example embodiments of the present invention have been described, those skilled in the art will readily appreciate that many modifications may be possible in the example embodiments of the present invention without materially departing from the novel teachings and advantages of the present invention. Accordingly, all such modifications are intended to be included within the scope of example embodiments of the present invention as defined in the claims. In the claims, means-plus-function clauses are intended to cover the structures described herein as performing the recited function and not only structural equivalents but also equivalent structures. Therefore, it is to be understood that the foregoing is illustrative of example embodiments of the present invention and is not to be construed as limited to the specific embodiments disclosed, and that modifications to the disclosed embodiments, as well as other example embodiments, are intended to be included within the scope of the appended claims. Example embodiments of the present invention are defined by the following claims, with equivalents of the claims to be included therein.

What is claimed is:

1. An organic insulator composition, comprising:
(i) a silane compound represented by Formula 2 below or a mixture or polymer of Formulas 1 and 2:

$$R_1SiX_1X_2X_3 \quad (1)$$

wherein $R_1$ is selected from the group consisting of $C_1$-$C_{20}$ alkyl, alkenyl, alkynyl, aryl, arylalkyl, cycloalkyl, heteroalkyl, heteroaryl and heteroarylalkyl groups in which the hydrogen atoms covalently bonded to the carbon atom(s) are wholly or partly replaced by fluorine atoms, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group, $$R_1R_2SiX_1X_2 \quad (2)$$

wherein $R_1$ and $R_2$ are each independently selected from the group consisting of $C_1$-$C_{20}$ alkyl, alkenyl, alkynyl, aryl, arylalkyl, cycloalkyl, heteroalkyl, heteroaryl and heteroarylalkyl groups, the hydrogen atoms in each of $R_1$ and $R_2$ covalently bonded to the carbon atom(s) are wholly or partly replaced by fluorine atoms, and $X_1$ and $X_2$ are each independently a halogen atom or a $C_1$-$C_{20}$ alkoxy group, with the proviso that at least one of $X_1$ and $X_2$ is a hydrolysable functional group, a mixture or polymer thereof, or a mixture or copolymer thereof with a compound represented by any one of Formulae 3 to 5 below:

$$SiX_1X_2X_3X_4 \quad (3)$$

$X_1$, $X_2$, $X_3$ and $X_4$ are each independently a halogen atom or a $C_1$-$C_{20}$ alkoxy group, with the proviso that at least one of $X_1$, $X_2$, $X_3$ and $X_4$ is a hydrolysable functional group, $$R_3SiX_1X_2X_3 \quad (4)$$

wherein $R_3$ is selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$, $X_2$ and $X_3$ are each independently a halogen atom or a $C_1$-$C_{20}$ alkoxy group, with the proviso that at least one of $X_1$, $X_2$ and $X_3$ is a hydrolysable functional group, $$R_3R_4SiX_1X_2 \quad (5)$$

wherein $R_3$ and $R_4$ are each independently selected from the group consisting of a hydrogen atom, substituted and unsubstituted $C_1$-$C_{20}$ alkyl groups, substituted and unsubstituted $C_2$-$C_{20}$ alkenyl groups, substituted and unsubstituted $C_2$-$C_{20}$ alkynyl groups; substituted and unsubstituted $C_6$-$C_{20}$ aryl groups, substituted and unsubstituted $C_6$-$C_{20}$ arylalkyl groups, substituted and unsubstituted $C_1$-$C_{20}$ heteroalkyl groups, substituted and unsubstituted $C_4$-$C_{20}$ heteroaryl groups, and substituted and unsubstituted $C_4$-$C_{20}$ heteroarylalkyl groups, and $X_1$ and $X_2$ are each independently a halogen atom or a $C_1$-$C_{20}$ alkoxy group, with the proviso that at least one of $X_1$ and $X_2$ is a hydrolysable functional group;

(ii) an organometallic compound; and
(iii) a solvent.

2. The organic insulator composition according to claim 1, wherein the organometallic compound is at least one compound selected from titanium compounds, zirconium compounds, hafnium compounds, and aluminum compounds.

3. The organic insulator composition according to claim 2, wherein the organometallic compound is at least one compound selected from the group consisting of titanium (IV) n-butoxide, titanium (IV) t-butoxide, titanium (IV) ethoxide, titanium (IV) 2-ethylhexoxide, titanium (IV) isopropoxide, titanium (IV) (diisopropoxide) bis(acetylacetonate), titanium (IV) oxide bis(acetylacetonate), trichlorotris(tetrahydrofuran) titanium (III), tris(2,2,6,6-tetramethyl-3,5-heptanedionato) titanium (III), (trimethyl)pentamethyl cyclopentadienyltitanium (IV), pentamethylcyclopentadienyltitanium trichloride (IV), pentamethylcyclopentadienyltitanium trimethoxide (IV), tetrachlorobis(cyclohexylmercapto) titanium (IV), tetrachlorobis(tetrahydrofuran)titanium (IV), tetrachlorodiamminetitanium (IV), tetrakis(diethylamino) titanium (IV), tetrakis(dimethylamino)titanium (IV), bis(t-butylcyclopentadienyl)titanium dichloride, bis (cyclopentadienyl)dicarbonyl titanium (II), bis (cyclopentadienyl)titanium dichloride, bis (ethylcyclopentadienyl)titanium dichloride, bis (pentamethylcyclopentadienyl)titanium dichloride, bis (isopropylcyclopentadienyl)titanium dichloride, tris(2,2,6,6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptanedionato)titanium (IV), dimethylbis(t-butylcyclopentadienyl)titanium (IV), di(isopropoxide)bis(2,2,6,6-tetramethyl-3,5-heptanedionato)titanium (IV), zirconium (IV) n-butoxide, zirconium (IV) t-butoxide, zirconium (IV) ethoxide, zirconium (IV) isopropoxide, zirconium (IV) n-propoxide, zirconium (IV) acetylacetonate, zirconium (IV) hexafluoroacetylacetonate, zirconium (IV) trifluoroacetylacetonate, tetrakis (diethylamino)zirconium, tetrakis(dimethylamino) zirconium, tetrakis(2,2,6,6-tetramethyl-3,5-heptanedionato) zirconium (IV), zirconium (IV) sulfate tetrahydrate, hafnium (IV) n-butoxide, hafnium (IV) t-butoxide, hafnium (IV) ethoxide, hafnium (IV) isopropoxide, hafnium (IV) isopropoxide monoisopropylate, hafnium (IV) acetylacetonate, tetrakis(dimethylamino)hafnium, aluminum n-butoxide, aluminum t-butoxide, aluminum sec-butoxide, aluminum ethoxide, aluminum isopropoxide, aluminum acetylacetonate, aluminum hexafluoroacetylacetonate, aluminum trifluoroacetylacetonate, and tris(2,2,6,6-tetramethyl-3,5-heptanedionato)aluminum.

4. The organic insulator composition according to claim 1, wherein the organic solvent is selected from the group consisting of: aliphatic hydrocarbon solvents, including hexane and heptane; aromatic hydrocarbon solvents, including toluene, pyridine, quinoline, anisole, mesitylene, and xylene; ketone-based solvents, including cyclohexanone, methyl ethyl ketone, 4-heptanone, methyl isobutyl ketone, 1-methyl-2-pyrrolidinone, and acetone; ether-based solvents, including tetrahydrofuran and isopropyl ether; acetate-based solvents, including ethyl acetate, butyl acetate and propylene glycol methyl ether acetate; alcohol-based solvents, including isopropyl alcohol and butyl alcohol; amide-based solvents, including dimethylacetamide and dimethylformamide; silicon-based solvents; and mixtures thereof.

5. The organic insulator composition according to claim 1, further comprising:
an organic or an inorganic polymer matrix with a molecular weight of between about 1,000 and about 1,000,000, and the organic or inorganic polymer matrix is selected from the group consisting of polyvinyl phenols and their derivatives, polyvinyl alcohols and their derivatives, polyacryls and their derivatives, polynorbornenes and their derivatives, polyethylene glycol derivatives, polypropylene glycol derivatives, polysiloxane derivatives, cellulose derivatives, and copolymers thereof.

6. The organic insulator composition according to claim 5, wherein the organic or inorganic polymer matrix contains a hydroxyl group, a carboxyl group or its salt, a phosphate group or its salt, a sulfonate group or its salt, or an amine group or its salt at the terminal position of its backbone or side chains.

7. The organic insulator composition according to claim 5, wherein the organic or inorganic polymer matrix is protected with an acid-labile protecting group selected from the group consisting of t-butyl, isobornyl, menthyl, 2-methyl-2-adamantanyl, 2-ethyl-2-adamantanyl, tetracyclodecanyl, tetrahydropyranoyl, 3-oxocyclohexanoyl, mevalonic lactonyl, dicyclopropylmethyl, methylcyclopropylmethyl, and methyl ethyl ether groups.

8. The organic insulator composition according to claim 5, wherein the composition comprises about 5 to 70% by weight of the silane compound, about 0.01 to 10% by weight of the organometallic compound, about 0.01 to 10% by weight of the organic or inorganic polymer matrix, and about 10 to 94% by weight of the organic solvent.

9. The organic insulator composition according to claim 1, wherein the composition includes about 5% to about 70% by weight of the silane compound, about 0.01% to about 10% by weight of the organometallic compound, and about 10% to about 94% by weight of the organic solvent.

10. An organic insulating film formed from the organic insulator composition according to claim 1.

11. An organic thin film transistor including a substrate, a gate electrode, an organic insulating film, an organic semiconductor layer and source/drain electrodes, wherein the organic insulating film is formed from the organic insulator composition according to claim 1.

12. The organic thin film transistor according to claim 11, wherein the organic semiconductor layer is made of a material selected from the group consisting of pentacene, polythiophene, polyaniline, polyacetylene, polypyrrole, polyphenylene vinylene, polythiophenethiazole, and derivatives thereof.

13. The organic thin film transistor according to claim 11, where the gate electrode and source/drain electrodes are made of a material selected from the group consisting of doped silicon (Si), gold (Au), silver (Ag), aluminum (Al), copper (Cu), nickel (Ni), chromium (Cr), molybdenum (Mo), tungsten (W), and indium tin oxide (ITO).

14. The organic thin film transistor according to claim 11, where the substrate is selected from the group consisting of glass, silicon, and plastic substrates.

15. The organic thin film transistor according to claim 11, where the organic thin film transistor has a top-contact, bottom-contact or top-gate structure.

16. An electronic device including the organic thin film transistor according to claim 11.

17. The electronic device according to claim 16, wherein the electronic device is a liquid crystal display (LCD), a photovoltaic device, an organic light-emitting device (OLED), a sensor, a memory device, or an integrated circuit.

18. A method of forming an organic thin film, comprising:
coating the organic insulator composition of claim 1 on a substrate; and
annealing the coated substrate.

19. A method of manufacturing an organic thin film transistor, comprising:
depositing a metal or electrically conductive polymer to form at least one gate electrode on a substrate;
forming the organic thin film, according to claim 18, on the at least one gate electrode and the substrate; and
forming source/drain electrodes and the organic semiconductor layer on the organic thin film.

* * * * *